(12) United States Patent
Allen

(10) Patent No.: US 6,213,708 B1
(45) Date of Patent: *Apr. 10, 2001

(54) SYSTEM FOR SORTING MULTIPLE SEMICONDUCTOR WAFERS

(75) Inventor: Sam H. Allen, New Braunfels, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/815,812

(22) Filed: Mar. 12, 1997

(51) Int. Cl.$^7$ .................................................. B65G 1/00
(52) U.S. Cl. .................... 414/627; 414/937; 414/416; 414/941; 414/744.3; 414/226.01; 901/40
(58) Field of Search .................... 118/719; 414/217, 414/416, 941, 939, 935, 937, 744.4, 744.5, 744.3, 744.1, 627, 226.01, 222.01, 222.09; 901/40

(56) References Cited

U.S. PATENT DOCUMENTS

| | | | |
|---|---|---|---|
| 4,501,527 | * | 2/1985 | Jacoby et al. ................. 414/744.3 X |
| 4,850,782 | * | 7/1989 | Focke ............................ 414/744.3 X |
| 5,085,556 | * | 2/1992 | Ohtomi ............................. 414/774.3 |
| 5,364,222 | * | 11/1994 | Akimoto et al. ................. 414/937 X |
| 5,558,482 | * | 9/1996 | Hiroki et al. .................... 414/939 X |
| 5,590,996 | * | 1/1997 | Thompson et al. ............. 414/937 X |
| 5,636,963 | * | 6/1997 | Haraguchi et al. ............. 414/937 X |
| 5,664,254 | * | 9/1997 | Ohkura et al. .................. 414/937 X |

FOREIGN PATENT DOCUMENTS

293231 * 12/1991 (JP) ...................................... 414/937

* cited by examiner

Primary Examiner—Frank E. Werner
(74) Attorney, Agent, or Firm—Kevin L. Daffer; Conley, Rose & Tayon

(57) ABSTRACT

A wafer sorting system is provided. The wafer sorter system is used to simultaneously sort multiple semiconductor wafers of a cassette. The wafer sorter system includes multiple arms which extend from a tower. These arms are at different vertical locations along the tower. The wafer sorter system also comprises a robotic arm which may move the tower to a position where the arms contact wafers. These wafers are in different vertical slots of a cassette. Further included in the wafer sorter system is a belt which may rotate to move arms vertically through slots of the tower. Wafers may become attached to arms by applying a vacuum suction to each arm. The arms having wafers may be rotated to the belt in a clockwise or counterclockwise direction about a portion of the tower via a slot in the tower. The arms may then be attached to the belt. After the belt moves the arms to new levels of the tower, the arms may then be rotated back to their original positions. The rearranged wafers may then be placed in their original cassette, in several different cassettes, or in one different cassette via turning off the vacuum suction.

27 Claims, 3 Drawing Sheets

SYSTEM FOR SORTING MULTIPLE SEMICONDUCTOR WAFERS

BACKGROUND OF THE INVENTION

1. Field of the Invention

The present invention relates to integrated circuit manufacturing and more specifically to simultaneously sorting and/or rearranging of multiple semiconductor wafers contained in a cassette.

2. Description of the Relevant Art

Semiconductor wafers used in integrated circuit manufacturing are usually stacked in slots of a cassette which holds the wafers. Wafers in a cassette typically undergo the same processing steps which is often referred to as a semiconductor "run". In some instances, however, it may be desirable to perform different processing steps on one or more wafers within a cassette. It may also be desirable to process wafers of a cassette in an order dissimilar from order used in a previous step. Therefore, wafers are sometimes split up into separate cassettes, randomized in their present cassettes, or transferred to another cassette of wafers. Movement of wafers among cassettes is generally carried out using a wafer sorter.

Wafer sorters typically handle one wafer at a time when splitting, transferring, or randomizing wafers within a cassette. In addition, conventional wafer sorters use two cassettes to randomize wafer locations within a target cassette. The wafers may be removed from a first (or target) cassette and stacked in a different order within a second cassette. Sometimes a second cassette may be unavailable, and the randomizing has to be delayed until a second cassette can be found. Because of this, a conventional wafer sort operation may take an unduly long time to complete the split, transfer or randomization operation.

It is therefore desirable that a wafer sorter be devised that handles multiple wafers at a time when splitting, transferring, or randomizing wafers of a cassette. Further, it is desirable that a wafer sorter need not require a second cassette for randomizing wafers of a cassette. A wafer sorter with these features would reduce the time required to order wafers according to the previous or subsequent processing steps. As such, the throughput needed to manufacture an integrated circuit can be reduced when the improved wafer sort characteristics are achieved.

SUMMARY OF THE INVENTION

The problems outlined above are in large part solved by an improved wafer sorting system of the present invention. That is, the wafer sorter system may handle more than one semiconductor wafer of a cassette at one time. Further, the present wafer sorter system does not require a second cassette when randomizing wafers of a cassette. The present wafer sorter system may be used in conjunction with any semiconductor processing tool, or can be used within a processing sequence separate from a processing tool.

In one embodiment, the wafer sorter system includes a "tower" which acts as a base for the components of the wafer sorter system. The wafer sorter system preferably includes multiple movable arms for holding wafers. These arms are located at different elevational levels, each of which are distributed a spaced distance from one another along a vertical axis of the tower. Each arm preferably protrudes horizontally from within the tower to outside the tower. Each arm may rotate horizontally about a portion of the tower in substantially clockwise and counterclockwise directions.

The wafer sorter system preferably includes a robotic arm for moving the tower. The robotic arm may move vertically and horizontally, and it may rotate about a vertical axis. The wafer sorter system further preferably includes a belt which forms a substantially oval loop from the top of the tower to the bottom of the tower. The belt is capable of moving one or more arms along a vertical axes into which an arm or a plurality of arms can be rotated.

In an embodiment, each arm is hollow, and a vacuum conduit is contained partially inside each arm for applying a vacuum suction to each arm. A vacuum suction is a force sufficient to hold a wafer against each arm. The vacuum conduit preferably extends from a port of each arm to a vacuum system. In another embodiment a vacuum system is connected to the bottom of the tower. A valve is preferably disposed within each arm to control when a vacuum suction is applied from the vacuum system to each arm for holding the wafer.

In an embodiment, each arm preferably includes an opening, in its upper surface through which the vacuum source is drawn. In another embodiment, each arm preferably includes a plurality of openings in its upper surface. A plate is preferably attached to an end of each arm on the inside of the tower. The width of the plate is preferably longer than the width of the arm. A clamp may be attached to the arm which may be clamped to a handle extending from the belt. Each handle is preferably an elongated arm. Two handles which are opposite to each other are connected to different sides of the belt at every level of the tower. An arm motor and shaft may be attached to the bottom of each arm. Further, each shaft contacts an inner surface of the tower so that each arm may be moved to the belt when the shaft rotates. A belt motor and shaft are located near the bottom of the belt. This shaft contacts the belt in order to move the belt in a clockwise direction when the shaft rotates. A computer is preferably used to program the movements of each arm and to control when the vacuum suction is applied.

In an embodiment, the tower includes several slots in its body that allow each arm to extend from within the tower to a point outside of the tower. A first interior slot preferably exists for each arm of the wafer sorter system. The first interior slot allows an arm to move horizontally in a counterclockwise direction from its original position to a position near one portion of the belt. The first interior slot further allows the same arm to move in a clockwise direction from its original position to a position near another portion of the belt. A second slot may extend from the top of the tower to the bottom of the tower to allow arms to move vertically down the tower. A third slot may extend from the top of the tower to the bottom of the tower to allow arms to move vertically up the tower.

In an embodiment, when sorting wafers of a cassette, the robotic arm moves the tower to a position near the cassette which allows each arm to be placed under a wafer located in a slot of the cassette. The vacuum suction is preferably is applied to only those arms which contact wafers that need to be moved for sorting. When the vacuum suction is applied to an arm, a wafer preferably becomes attached to the arm. Each arm motor may be activated in order to rotate a shaft which moves an arm about the tower from its original position in a direction either 90 degrees clockwise or 90 degrees counterclockwise. The shaft's rotation direction may be pre-programmed so that each arm moves in almost any desired direction. An arm preferably rotates about the tower in a clockwise direction if the wafer needs to be moved down in a cassette. An arm preferably rotates about the tower in a counterclockwise direction if the wafer needs to be moved up in a cassette.

In an embodiment, after an arm is rotated about the tower, it is clamped onto the belt. The belt motor is then activated in order to rotate the belt shaft. The shaft preferably causes the belt to rotate in a clockwise direction. Each arm attached to the belt is preferably moved vertically. The belt motor is programmed to stop running when each arm reaches its destination above or below its first level of location (or point of origination). Once an arm has reached its desired new level, it is unattached from the belt. The arm motor is then activated so that the arm is rotated to a new slot in a cassette, and the vacuum suction is removed so that the wafer remains in the new slot.

In an embodiment, the plate attached to the end of each arm prevents an arm from rotating to a position where another arm is located within the same horizontal plane. If the plate contacts a different arm, rotation is ceased and the rotating arm is preferably maintained in its original position.

All of the embodiments discussed above may be combined or used individually.

BRIEF DESCRIPTION OF THE DRAWINGS

Other objects and advantages of the invention will become apparent upon reading the following detailed description and upon reference to the accompanying drawings in which.

Figures 1A, 1B:
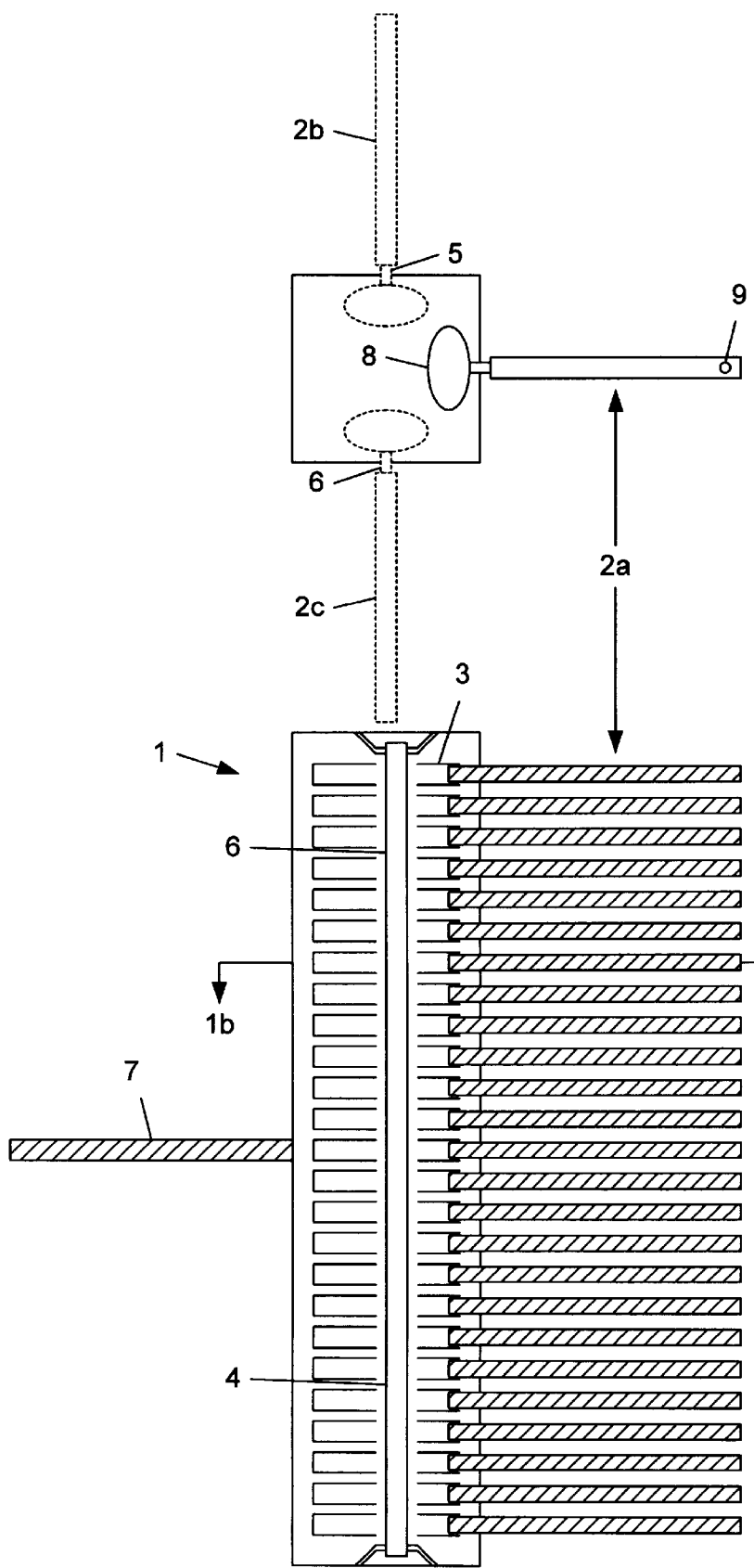
FIG. 1a is a side plan view of a wafer sorter system according to the present invention.
FIG. 1b is a view along plane 1b of FIG. 1a showing one elevational level of the wafer sorter system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. DETAILED DESCRIPTION OF THE INVENTION Turning now to FIG. 1a, an embodiment of a wafer sorter system is shown in which a tower 1 houses the components of the system. Multiple arms 2a preferably extend from tower 1. Each arm 2a may hold a wafer when a vacuum suction is applied to each arm 2a via a vacuum conduit (not shown) extending into a hollow portion of each arm 2a. A belt 4 extends vertically along tower 1. Belt 4 may rotate in a clockwise direction to move arms 2a up or down when they are attached to belt 4. Robotic arm 7 is preferably attached to one side of tower 1 for moving tower 1 to cassettes of wafers. Robotic arm 7 may place arms 2a under wafers which are stacked in slots of a cassette.

Furthermore, first interior slots 3 preferably exist on each level of tower 1. They form openings in tower 1 to allow arms 2a to move about a portion of tower 1 in substantially clockwise or counterclockwise directions. Arms 2a may need to rotate in these directions in order to be clamped to belt 4. A second slot 6 preferably extends from the top of tower 1 to the bottom of tower 1. Slot 6 may allow arms 2a to be moved vertically down tower 1 by belt 4. A portion of robotic arm 7 is shown.

FIG. 1b illustrates a cross-section of the wafer sorter system along plane 1b of FIG. 1a. One level of tower 1 is presented as viewed from a vantage point above tower 1. As shown, each arm 2a may move from its original position where it picks up wafers to other positions. Each arm 2a may move in a substantially counterclockwise direction to position 2b (dotted arm 2b). At position 2b each arm may be attached to one side of belt 4. A third slot 5 preferably extends from the top of tower 1 to the bottom of tower 1. Slot 5 preferably allows belt 4 to move arms 2a vertically up tower 1. Each arm 2a may also move in a substantially clockwise direction to position 2c (dotted arm 2c). At position 2c each arm may be attached to another side of belt 4 in order to be moved down tower 1 through slot 6. FIG. 1b further illustrates that a plate 8 is preferably attached to each arm 2a. Plate 8 may be substantially rectangular shaped or oval shaped, and plate 8 is preferably wider than arm 2a. Plate 8 is depicted as being substantially oval shaped in FIG. 1b. The function of plate 8 is preferably to prevent arm 2a from moving to a location where another arm is located within the same horizontal plane. Plate 8 allows arm 2a to stop moving when plate 8 contacts another plate in the same plate. Further, each arm 2a preferably includes an opening 9 in its upper surface which allows a vacuum suction to be applied to a wafer. In another embodiment, each arm 2a may include a plurality of openings (not shown) in its upper surface.

Figure 2:
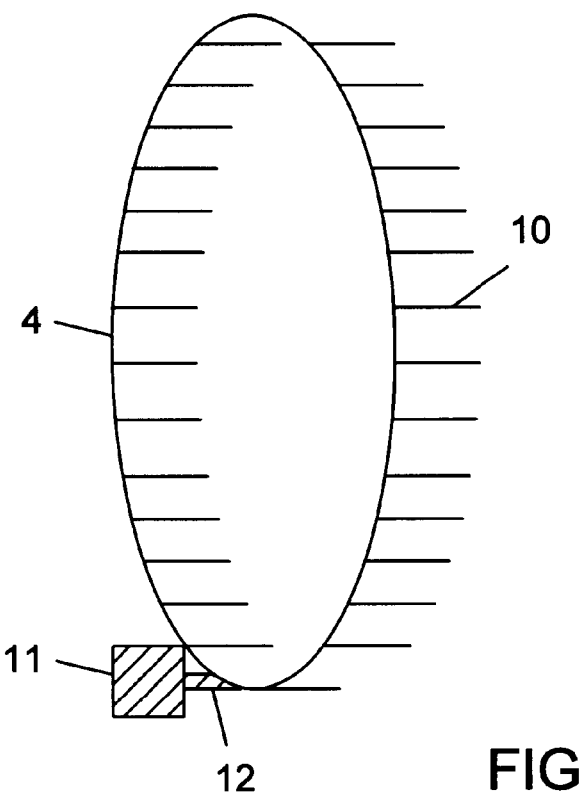
FIG. 2 is a side plan view of a substantially vertical reciprocating belt belonging to the wafer sorter system.

FIG. 2 shows belt 4 in more detail. Belt 4 preferably forms a substantially oval shaped loop. Handles 10, which are preferably elongated arms, are preferably connected to belt 4. Arms 2a may be clamped to handles 10 so that belt 4 can move arms 2a vertically. Two handles are preferably located at each level of tower 1 on opposite sides of belt 4. A stepper motor 11 is preferably located near the bottom of belt 4 which operates a shaft 12. Shaft 12 contacts belt 4 to move the belt in the direction desired. When motor 11 is running, shaft 12 preferably rotates in a substantially counterclockwise direction and forces belt 4 to rotate in a substantially clockwise direction.

Figure 3:
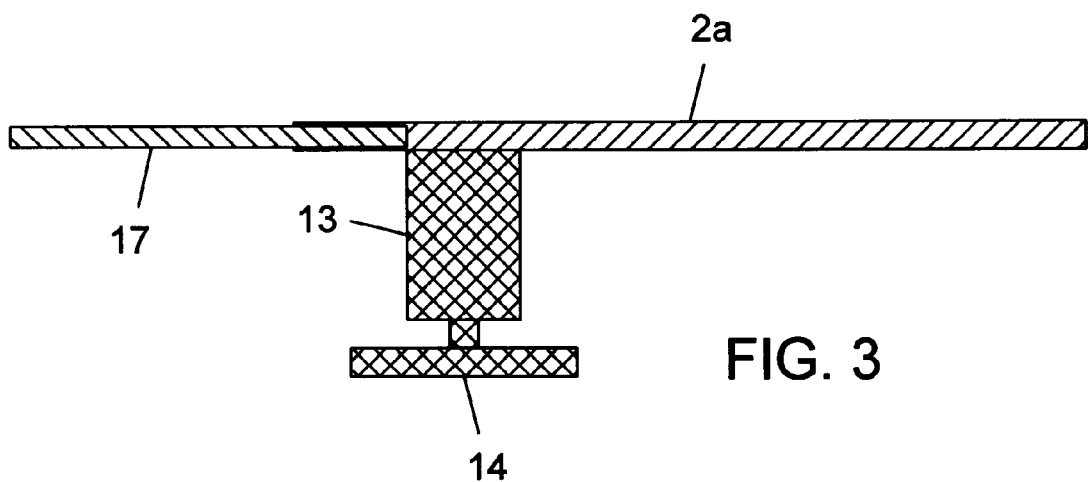
FIG. 3 is a side plan view of an arm belonging to the wafer sorter system.
Figure 4:
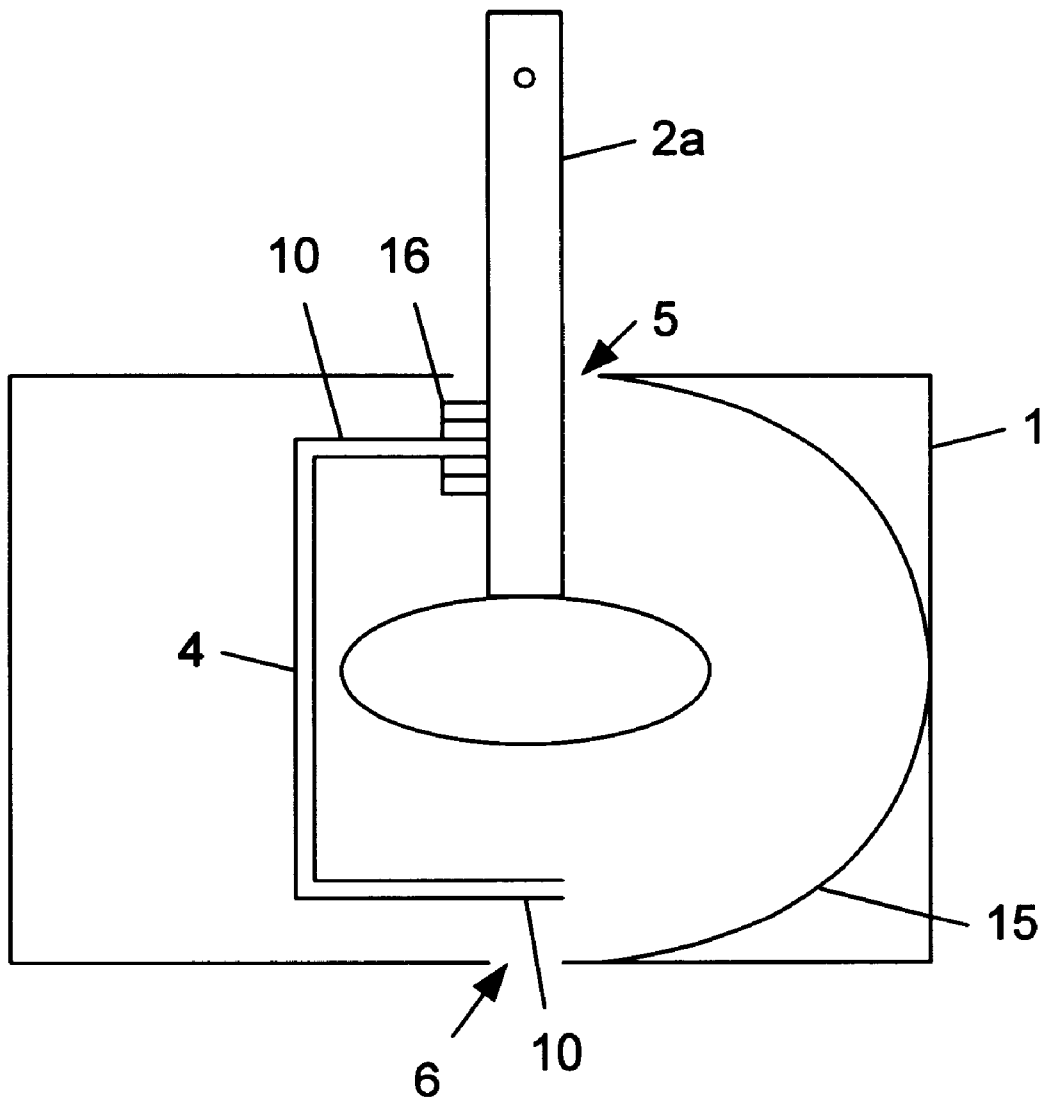
FIG. 4 is a top plan view along one elevational plane of the wafer sorter system.

Turning now to FIG. 3, more details regarding a side view of an arm 2a are shown. A shaft motor 13 is preferably attached to the bottom of each arm 2a. Motor 13 rotates shaft 14 during its operation. A portion of vacuum conduit 17 is depicted extending into the hollow inner diameter of arm 2a. A vacuum conduit 17 preferably extends from within each arm 2a to a vacuum source (not shown). FIG. 4 depicts a top plan view of one level of tower 1. Tower 1 preferably has an inner surface 15 which substantially curves outward from slot 5 to slot 6. When shaft 14 rotates in a clockwise direction, it does so within a horizontal plane defined as a slot (i.e., slot 3 shown in FIG. 1a). Horizontal rotation affords movement from one vertical slot position (slot 5) to another vertical slot position (slot 6), all within the common horizontal slot (slot 3). As such, a horizontal slot is defined as a contiguous opening within the tower housing, the horizontal slot being isolated to a particular elevation level. There are a number of horizontal slots extending a spaced distance from each other along the horizontal length of tower 1. When shaft 14 rotates in a substantially counterclockwise direction within a given horizontal slot (i.e., within a particular slot 3 among numerous slots dependent upon the elevation of rotation), arm 2a is moved from its original position within slot 5 to slot 6.

FIG. 4 further illustrates how each arm 2a may be attached to belt 4. A clamp 16 is preferably attached to arm 2a. Clamp 16 may be clamped to handle 10 to attach arm 2a to belt 4. Then when belt 4 rotates, arm 2a may move up slot 5.

An advantage of the wafer sorter system of the present invention is that arms 2a allow multiple semiconductor wafers to be sorted simultaneously. Each arm 2a may be moved by robotic arm 7 to positions where they contact wafers in a cassette. Wafers of the cassette that need to be sorted may become attached to their respective arms 2a by applying a vacuum suction to these wafers. Arms 2a having wafers attached to them may be rotated substantially clockwise to position 2c or counterclockwise to position 2b simultaneously. The rotated arms 2a may be clamped to one side of belt 4, and belt 4 may move these arms vertically up or down to different vertical positions. These arms 2a may then be rotated simultaneously back to their original positions where they may be inserted into slots of a cassette. The wafers attached to arms 2a may then be placed in their original cassette, placed in a new cassette, or placed in more than one cassette. Therefore, wafers may be randomized quickly in a cassette, they may be transferred rapidly to a new cassette, or they may be split up quickly into separate cassettes.

Further modifications and alternative embodiments of various aspects of the invention will be apparent to those skilled in the art in view of this description. Accordingly, this description is to be construed as illustrative only and is for the purpose of teaching those skilled in the art the general manner of carrying cut the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all is would be apparent to one skilled in the art after having the benefit of this description of the invention. Changes may be made in the elements described herein without departing from the spirit and scope of the invention as described in the following claims.

What is claimed is:

1. A wafer sorter system for handling and sorting wafers, comprising:
   a tower for housing the wafer sorter system;
   a movable arm extending from the tower for holding a wafer, the arm being adapted to rotate about a portion of the tower, and wherein the arm comprises an upper surface, and wherein the upper surface comprises an opening, for applying a vacuum suction to a wafer;
   a first interior slot through which the arm is adapted to rotate about a portion of the tower;
   a second slot extending from a top of the tower to a bottom of the tower through which the arm is adapted to move vertically down the tower;
   a vacuum conduit partially disposed within an end of the arm opposite the opening, wherein the arm is hollow to allow a vacuum suction to be applied to the arm through the vacuum conduit; and
   a belt at least partially located within the tower for moving the arm vertically.

2. The wafer sorter system of claim 1, further comprising a plate connected to one end of the arm, wherein the plate is located within the tower.

3. The wafer sorter system of claim 2, wherein the plate is substantially oval shaped.

4. The wafer sorter system of claim 1, wherein the belt comprises a handle, and further comprising a clamp attached to the arm for attaching the arm to the handle.

5. The wafer sorter system of claim 1, wherein the tower further comprises a third slot extending from a top of the tower to a bottom of the tower through which the arm is adapted to move vertically up the tower.

6. The wafer sorter system of claim 5, wherein the tower further comprises an inner surface, the inner surface substantially curving outward from the second slot to the third slot.

7. The wafer sorter system of claim 6, further comprising an arm motor attached to a bottom of the arm and a shaft attached to a bottom of the motor, the shaft contacting the inner surface for moving the arm about the tower.

8. The wafer sorter system of claim 1, wherein the belt forms a substantially oval shaped loop.

9. The wafer sorter system of claim 1, wherein the belt extends from a top of the tower to a bottom of the tower.

10. The wafer sorter system of claim 1, wherein the belt forms a substantially oval shaped loop, and wherein the belt is adapted to rotate clockwise.

11. The wafer sorter system of claim 1, further comprising a shaft for rotating the belt, the shaft contacting a bottom of the belt.

12. The wafer sorter system of claim 11, further comprising a belt motor attached to the shaft for operating the shaft.

13. The wafer sorter system of claim 1, wherein the arm is a first arm, and further comprising a plurality of arms for sorting a plurality of wafers, wherein the first arm is a first one of the plurality of arms, and wherein the plurality of arms extend from the tower for holding the wafers, and wherein the plurality of arms are adapted to rotate about a portion of the tower, and wherein the plurality of arms are hollow to allow a vacuum suction to be applied to the wafers, and wherein the plurality of arms are at different vertical positions along the tower.

14. The wafer sorter system of claim 1, further comprising a robotic arm for moving the tower, the robotic arm being connected to the tower.

15. A wafer sorter system, comprising:
   a tower for housing at least a portion of the wafer sorter system;
   a plurality of movable arms extending from the tower for holding wafers, each of the plurality of movable arms being adapted to independently rotate about and within the tower, wherein the plurality of movable arms are configured to concurrently exist at differing vertical positions along the tower;
   a plurality of rotating mechanisms for independently rotating each of the plurality of movable arms about and within the tower; and
   a belt at least partially located within the tower for moving the plurality of movable arms.

16. The wafer sorter system of claim 15, wherein each of the plurality of movable arms comprises an opening configured on an upper surface thereof for applying a vacuum suction to a wafer.

17. The wafer sorter system of claim 16, further comprising a robotic arm connected to the tower for moving the tower.

18. The wafer sorter system of claim 15, wherein each of the plurality of movable arms is configured to be attached to and detached from the belt during use, and wherein the belt is configured such that rotating the belt vertically while a first moveable arm of the plurality of moveable arms is attached to the belt moves the first moveable arm vertically within the tower.

19. The wafer sorter system of claim 18, wherein the tower further comprises a second slot through which the plurality of movable arms are adapted to move vertically down the tower.

20. The wafer sorter system of claim 19, wherein the tower further comprises a third slot through which the plurality of movable arms are adapted to move vertically up the tower.

21. The wafer sorter system of claim 20, wherein the belt is further configured such that rotating the belt vertically while the first moveable arm of the plurality of moveable arms is within the second slot and attached to the belt moves the first moveable arm downwards within the tower, and wherein the belt is further configured such that rotating the belt vertically while a second moveable arm of the plurality of moveable arms is within the third slot and attached to the belt moves the second moveable arm upwards within the tower.

22. The wafer sorter system of claim 21, wherein the tower comprises a plurality of first interior slots through which the plurality of movable arms are adapted to rotate about the tower, and wherein each of the plurality of movable arms is configured to rotate within a respective one of the plurality of first interior slots between a first position adjacent the second slot and a second position adjacent the third slot.

23. The wafer sorter system of claim 22, wherein the third slot is on an opposite side of the tower from the second slot.

24. The wafer sorter system of claim 22, wherein each of the plurality of rotating mechanism comprises:
   a plurality of arm motors attached to a bottom of each of the plurality of movable arms and;
   a plurality of shafts each attached to a bottom of each of the plurality of arm motors and each contacting an inner surface of the tower for moving a respective movable arm about the tower.

25. The wafer sorter system of claim 18, wherein the belt further comprises a plurality of handles, and further comprising a plurality of clamps for clamping the plurality of moveable arms to respective ones of the plurality of handles.

26. The wafer sorter system of claim 18, wherein each of the plurality of rotating mechanisms is configured to rotate a respective movable arm and comprises an arm motor coupled to a shaft, and wherein each arm motor is configured to drive the respective shaft for rotating the respective movable arm about and within the tower.

27. The wafer sorter system of claim 25, wherein each of the plurality of arm motors of each of the plurality of rotating mechanisms is configured to drive the respective shaft for rotating the respective movable arm about and within the tower in a clockwise or counter-clockwise direction.

* * * * *

UNITED STATES PATENT AND TRADEMARK OFFICE
CERTIFICATE OF CORRECTION

PATENT NO. : 6,213,708 B1
DATED : April 10, 2001
INVENTOR(S) : Allen

Page 1 of 1

It is certified that error appears in the above-identified patent and that said Letters Patent is hereby corrected as shown below:

Claims,
Claim 1, column 5,
Line 48, please delete the comma between the words "opening" and "for".

Claim 26, column 8,
Line 13, after the phrase "system of claim" please delete the number "18" and substitute therefor -- 15 --.

Claim 27, column 8,
Line 19, after the phrase "system of claim" please delete the number "25" and substitute therefor -- 26 --.

Signed and Sealed this

Second Day of October, 2001

Attest:

*Nicholas P. Godici*

NICHOLAS P. GODICI
*Acting Director of the United States Patent and Trademark Office*

*Attesting Officer*